United States Patent [19]

Yokota et al.

[11] Patent Number: 5,311,452

[45] Date of Patent: May 10, 1994

[54] PLASMA PROCESSING APPARATUS USING CAPACITANCE MANOMETER AND PRESSURE CONTROL METHOD THEREOF

[75] Inventors: Takashi Yokota; Osamu Kamikanda, both of Yokohama, Japan

[73] Assignee: Tokyo Electron Limited, Tokyo, Japan

[21] Appl. No.: 799,197

[22] Filed: Nov. 27, 1991

[30] Foreign Application Priority Data

Nov. 28, 1990 [JP] Japan .................. 2-331319

[51] Int. Cl.⁵ .................. G01F 25/00; G01L 27/00; C23F 1/00
[52] U.S. Cl. ................. 364/571.05; 364/571.02; 364/558; 73/4 R; 156/345
[58] Field of Search ............... 73/1 R, 4 R, 4 V; 364/558, 571.01, 571.02, 571.05, 558; 427/570; 156/345

[56] References Cited

U.S. PATENT DOCUMENTS

| | | | |
|---|---|---|---|
| 4,383,431 | 5/1983 | Gelernt | 73/4 R |
| 4,446,715 | 5/1984 | Bailey | 73/1 R |
| 4,542,638 | 9/1985 | Tlaker | 73/1 R |
| 4,590,791 | 5/1986 | Reed et al. | 73/4 R X |
| 4,598,381 | 7/1986 | Cucci | 364/571.05 X |
| 4,800,513 | 1/1989 | Deutsch | 364/571.02 |
| 4,838,978 | 6/1989 | Sekine et al. | 156/345 |
| 4,866,640 | 9/1989 | Morrison, Jr. | 364/558 |
| 4,902,531 | 2/1990 | Nakayama et al. | 427/570 |

Primary Examiner—Jack B. Harvey
Assistant Examiner—Eric W. Stamber
Attorney, Agent, or Firm—Oblon, Spivak, McClelland, Maier & Neustadt

[57] ABSTRACT

A pressure gage detects a pressure in a vacuum-processing container as an electrical signal. A pressure detection signal from the pressure gage includes an error over time. An error detecting unit detects a signal representing the error which is output from the pressure gage while the vacuum-processing container is set at a predetermined calibration pressure. A correction value calculating unit calculates, in accordance with the signal representing the error which is detected by the error detecting unit, a signal representing a correction value used in order to cancel the signal representing the error. A correcting unit adds the pressure detection signal from the pressure gage to the signal representing the correction value which is calculated by the correction value calculating unit while an instruction for setting an interior of the vacuum-processing container at a desired pressure value is output, thereby eliminating the error over time which is included in the pressure detection signal. A pressure controlling unit controls the interior of the vacuum-processing container at the desired pressure value in accordance with an output signal from which the error over time has been eliminated by the correcting unit.

18 Claims, 5 Drawing Sheets

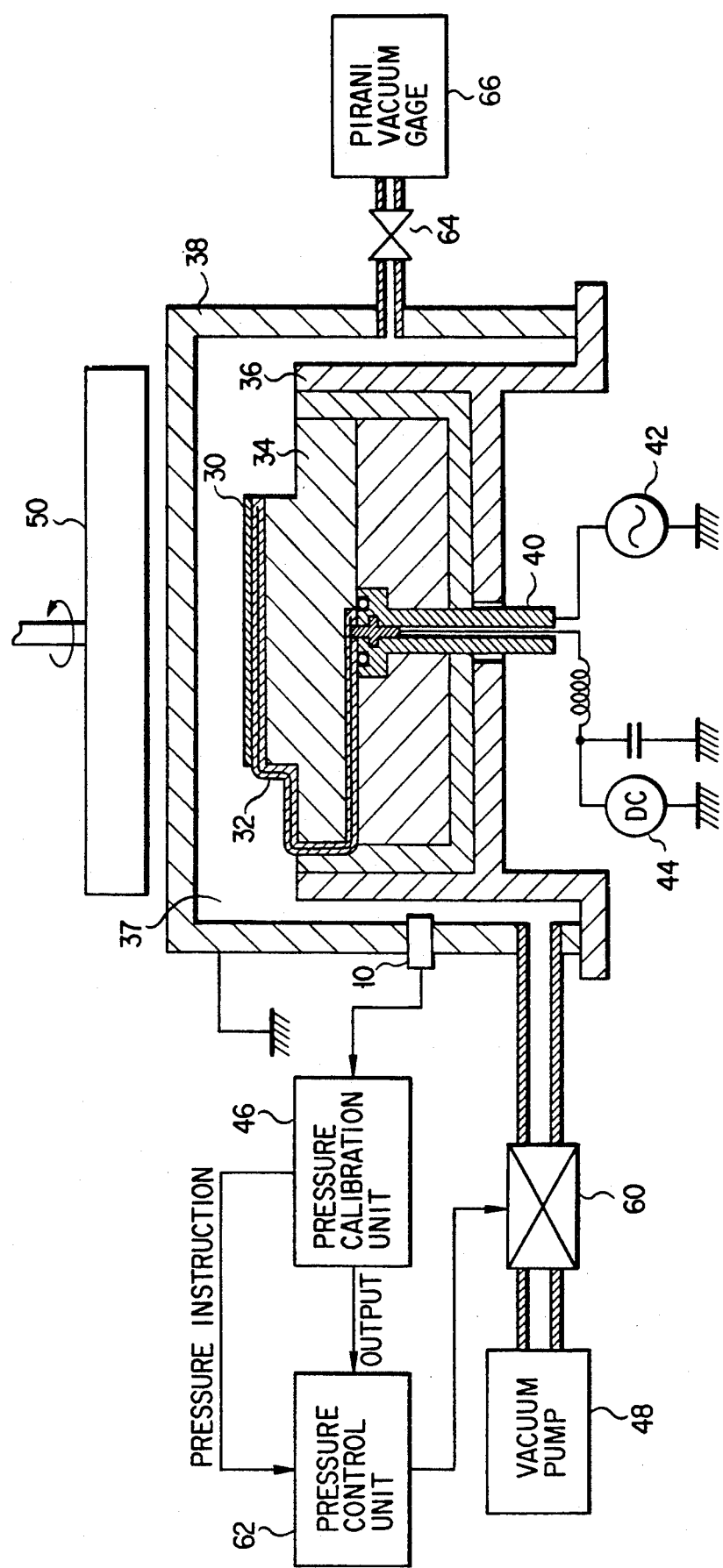
F I G. 1

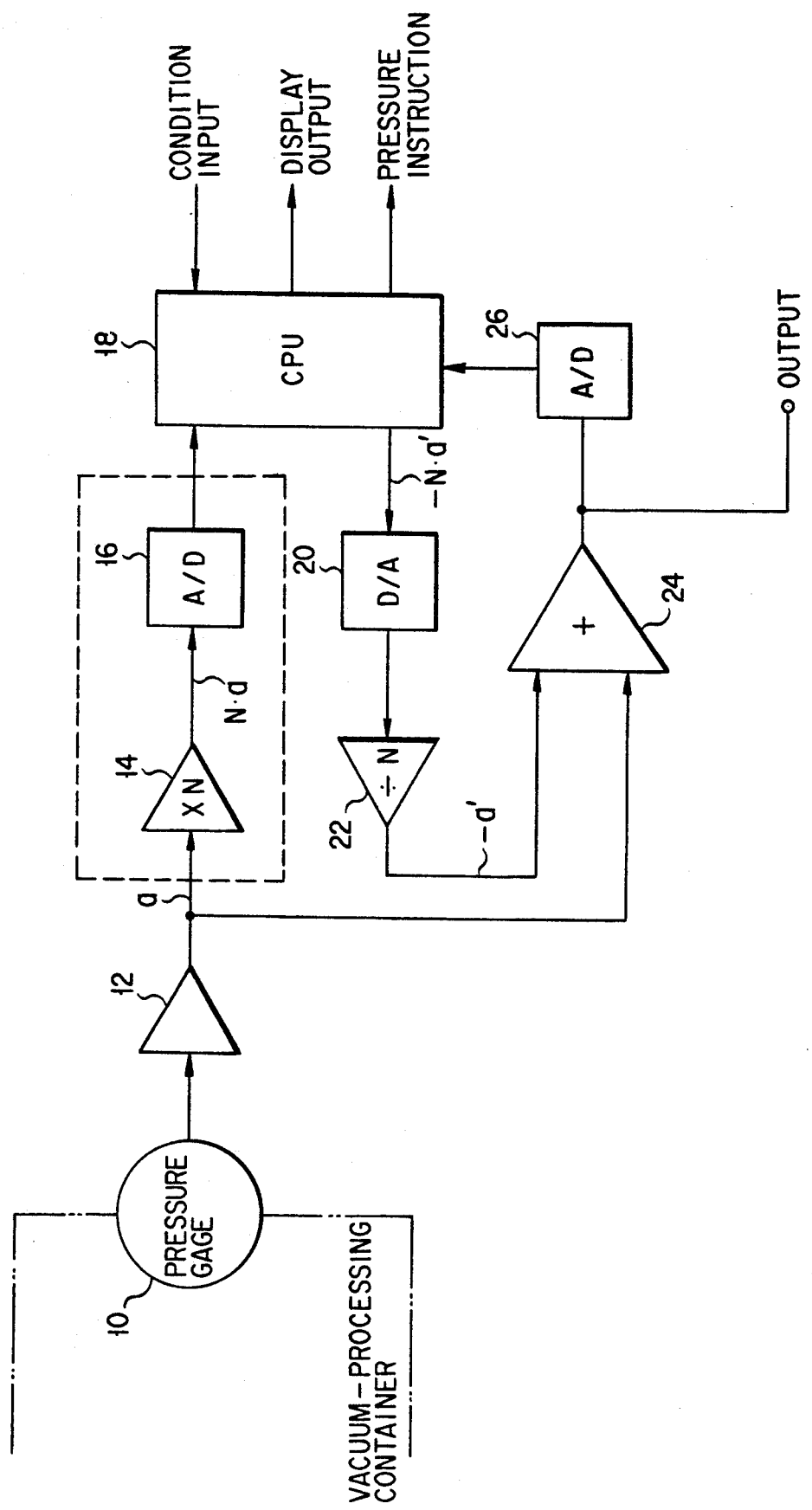
F I G. 2

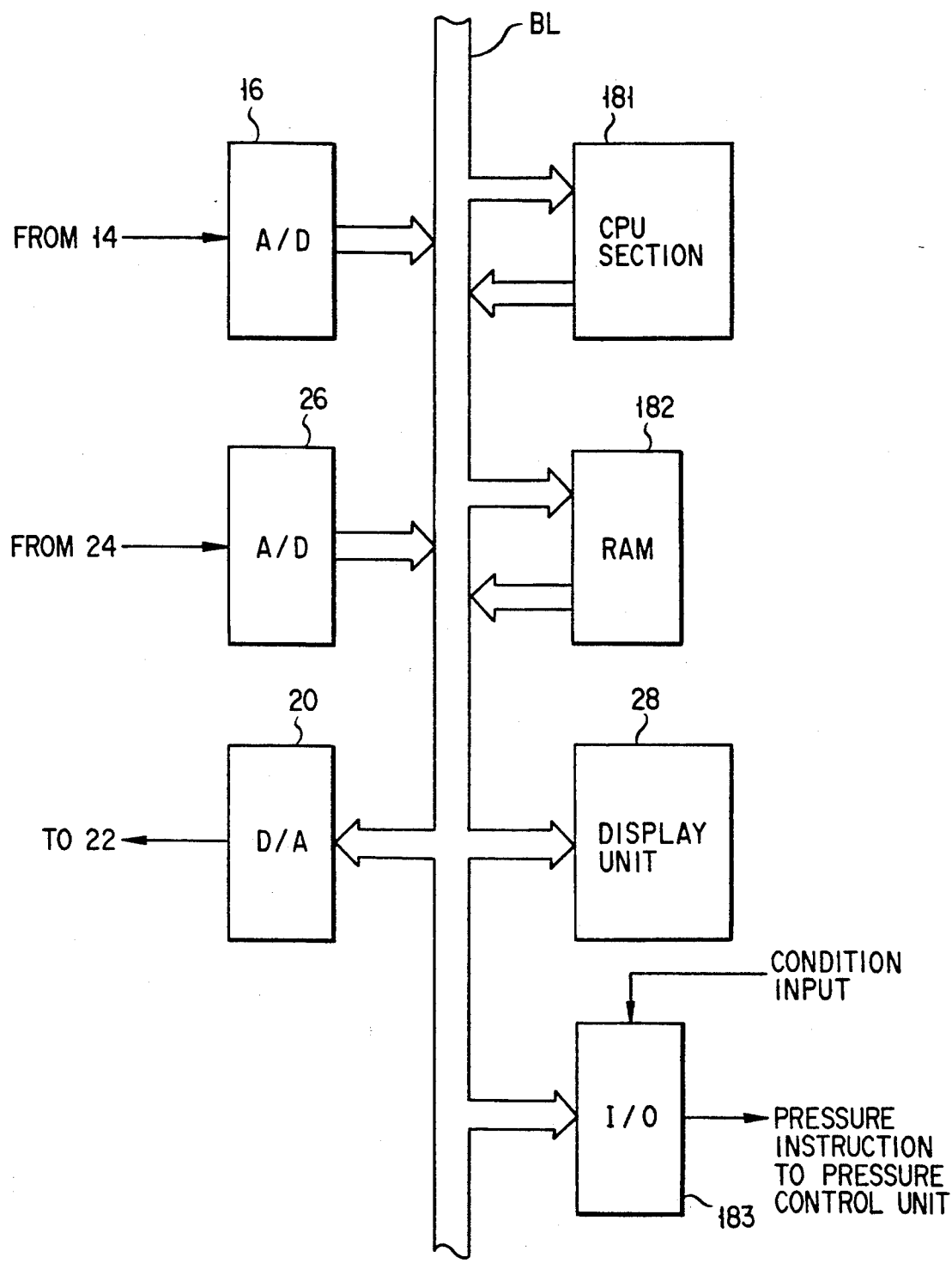
F I G. 3

PLASMA PROCESSING APPARATUS USING CAPACITANCE MANOMETER AND PRESSURE CONTROL METHOD THEREOF

BACKGROUND OF THE INVENTION

1. Field of the Invention

The present invention generally relates to a vacuum-processing apparatus and, in particular, to a vacuum-processing apparatus with an auto-calibration for an output of a pressure gage.

2 Description of the Related Art

In the process of manufacturing a semiconductor device, various types of well-known vacuum-processing apparatuses are used.

For example, a plasma etching apparatus is developed as one of the apparatuses that execute the dry etching technique for performing ultra micropatterning so as to satisfy the recent demand for high-density packaging and high integration. That is, the plasma etching apparatus utilizes a technique for producing a volatile material by causing ions or molecules in a plasma, which is generated by discharge in a processing chamber set at a low vacuum by introducing a predetermined gas, to react with a material to be etched.

In various types of vacuum-processing apparatuses such as a plasma etching apparatus, for example, to control the vacuum degree of the processing chamber at a predetermined value is an important factor that significantly influences the yield of the product. In this case, a pressure gage used for detecting the pressure, i.e., the vacuum degree of the processing chamber must have an anticorrosion property against a gas and the like subjected to reactions in the processing chamber and must be able to constantly detect an accurate vacuum degree.

For this purpose, for example, a pressure gage called a capacitance manometer which has an anticorrosion property is used in order to detect the pressure in the processing chamber and to control the detected vacuum state.

A conventional vacuum-processing apparatus uses such a pressure gage to detect the pressure state in the processing chamber as a voltage signal and to control and drive a pump and the like which performs vacuum suction of the interior of the processing chamber based on an output signal.

However, in the pressure gage of this type, its output value largely varies from time to time. Therefore, calibration of the pressure gage output must be performed at least once a day to perform zero point adjustment.

This zero point adjustment (calibration) of the pressure gage output is conventionally performed by an operator by manually operating a volume control so that the meter value indicates the 0 point.

In order to constantly adjust an error of the pressure gage in this manner, volume control adjustment of the pressure gage must be frequently performed manually, leading to a cumbersome operation. If the operator has forgotten to perform the 0 point adjustment, the interior of the vacuum chamber cannot be set in an appropriate vacuum state. When processing is to be performed in this chamber, an appropriate processing condition cannot be set. In a worst case, a pump and the like may overrun and thus cause an accident.

SUMMARY OF THE INVENTION

It is, therefore, an object of the present invention to provide a new and improved vacuum-processing apparatus with an auto-calibration for an output of a pressure gage, in which an error in pressure gage output is automatically calibrated with a simple structure, thereby constantly controlling the pressure in the processing chamber to a predetermined value.

It is another object of the present invention to provide a plasma-processing apparatus in which an error in pressure gage output is automatically calibrated with a simple structure, and the pressure in the processing chamber is constantly controlled to a predetermined value, thereby setting an appropriate plasma-processing condition.

According to one aspect of the present invention, there is provided a vacuum-processing apparatus comprising:

a pressure gage for detecting a pressure in a vacuum-processing container as an electrical signal, the pressure gage having a pressure detection signal including an error over time;

error detecting means for detecting a signal representing the error which is output from the pressure gage while the vacuum-processing container is set at a predetermined calibration pressure;

correction value calculating means for calculating, in accordance with the signal representing the error which is detected by the error detecting means, a signal representing a correction value used in order to cancel the signal representing the error;

correcting means for adding the pressure detection signal from the pressure gage to the signal representing the correction value which is calculated by the correction value calculating means while an instruction for setting an interior of the vacuum-processing container at a desired pressure value is output, thereby eliminating the error over time which is included in the pressure detection signal; and pressure controlling means for controlling the interior of the vacuum-processing container at the desired pressure value in accordance with an output signal from which the error over time has been eliminated by the correcting means.

According to another aspect of the present invention, there is provided a plasma-processing apparatus comprising:

a pressure gage for detecting a pressure in a plasma-processing container as an electrical signal, the pressure gage having a pressure detection signal including an error over time;

error detecting means for detecting a signal representing the error which is output from the pressure gage while the plasma-processing container is set at a predetermined calibration pressure;

correction value calculating means for calculating, in accordance with the signal representing the error which is detected by the error detecting means, a signal representing a correction value used in order to cancel the signal representing the error;

correcting means for adding the pressure detection signal from the pressure gage to the signal representing the correction value which is calculated by the correction value calculating means while an instruction for setting an interior of the plasma-processing container at a desired pressure value is output, thereby eliminating the error over time which is included in the pressure detection signal; and pressure controlling means for controlling the interior of the plasma-processing container at the desired pressure value in accordance with an output signal from which the error over time has been eliminated by the correcting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a diagram showing the overall configuration of an embodiment of the present invention;

FIG. 2 is a block diagram showing a practical arrangement of a pressure calibration unit used in FIG. 1;

FIG. 3 is a block diagram showing the CPU with its peripheral circuits used in FIG. 2 in more detail.

DETAILED DESCRIPTION OF THE PREFERRED EMBODIMENTS

Figure 4A:
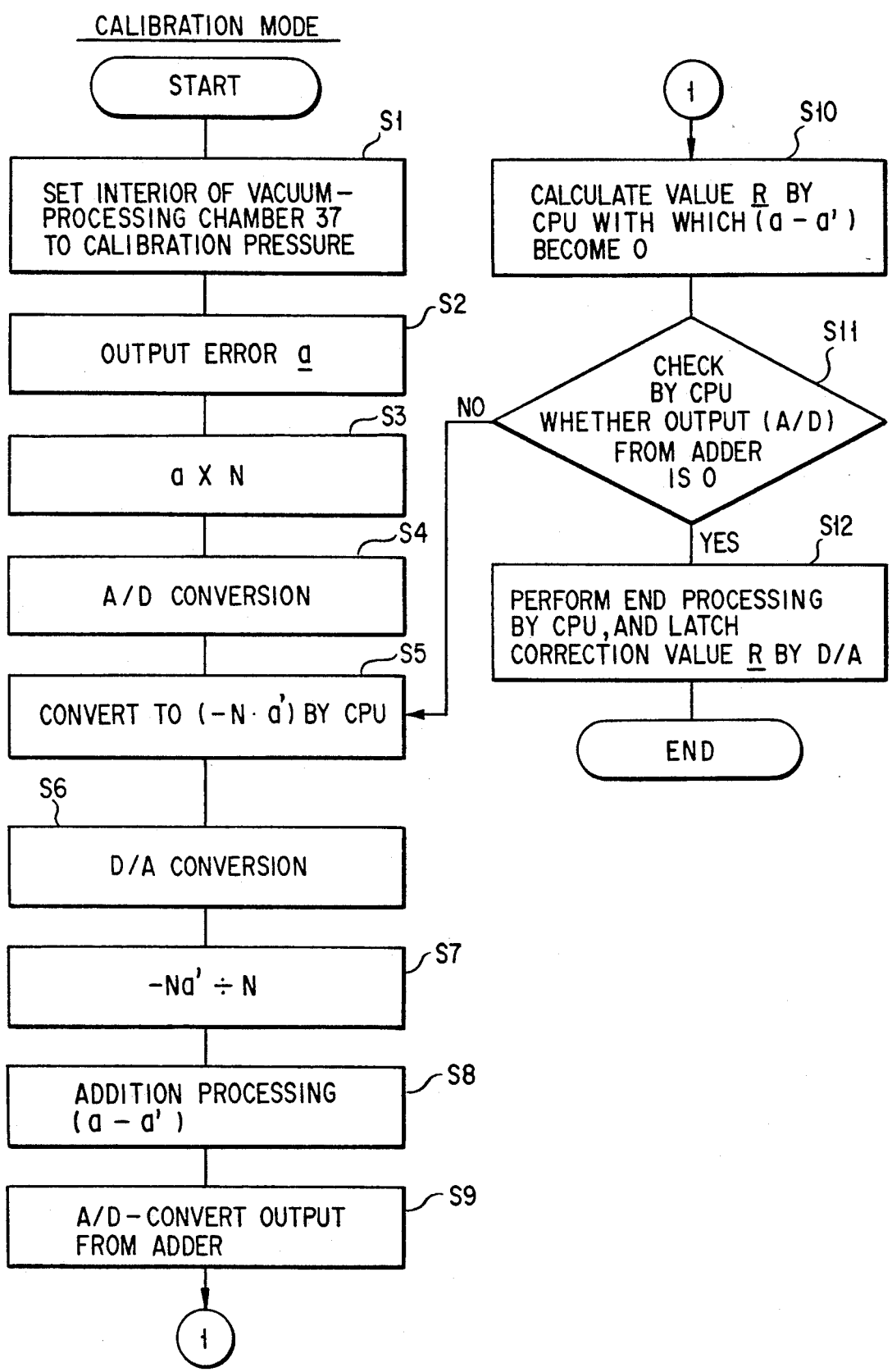
FIGS. 4A and 4B are flow charts for explaining an operation according to the embodiment of the present invention.

Reference will now be made in detail to the presently preferred embodiments of the invention as illustrated in the accompanying drawings, in which like reference characters designate like or corresponding parts throughout the several drawings.

A preferred embodiment of the present invention will be described in detail with reference to the accompanying drawings.

A case will first be described in which a vacuum-processing apparatus with an auto-calibration for an output of a pressure gage according to the present invention is applied to a magnetron plasma etching apparatus which is one type of plasma etching apparatus.

The pressure gage used in this embodiment will be described. This pressure gage is, e.g., a capacitance manometer (tradename: Baratron) which is in principle a type of differential pressure gage and which has an anticorrosion property as described above, and outputs a linear output of, e.g., 0 to 10 V upon reception of a pressure of 0 to 1 Torr as a target.

FIG. 1 is a schematic sectional view showing the overall configuration of the magnetron plasma etching apparatus. A semiconductor wafer 30 as an object to be processed is placed on an electrostatic chuck 32. The electrostatic chuck 32 is fixed on a susceptor 34.

A chamber constituting a vacuum-processing chamber (reaction chamber) consists of upper and lower chambers 38 and 36. A lower portion of the lower chamber 36 is coupled to the upper chamber 38, thereby constituting a vacuum-processing chamber 37.

This apparatus employs RIE-type plasma etching. The upper chamber 38 constituting a counter electrode of the susceptor 34 is grounded, and the susceptor 34 serves as the RF cathode. Outside the upper chamber 38, e.g., a permanent magnet 50 is provided to form a parallel magnetic field on the surface of the wafer 30. Magnetron plasma discharge is caused by the parallel electric field obtained by the magnet 50 and an electric field (to be described later) which is generated to be perpendicular to the surface of the wafer 30. As a result, plasma processing at a low pressure of, e.g., about several tens of mTorr is enabled in the presence of a predetermined gas introduced by a means (not shown).

The electrostatic chuck 32 is connected to a DC power supply 44 so that the wafer 30 is attracted electrostatically. The susceptor 34 is connected to an RF power supply 42 which outputs an industrial RF power of, e.g., 2.45 GHz, 13.75 kHz, or 358 kHz, so that orthogonal electric fields are formed between the susceptor 34 and the upper chamber 38.

The operation of the plasma-etching apparatus is as follows. When the interior of the vacuum-processing chamber 37 is evacuated to a predetermined vacuum degree through a vacuum pump 48 and a variable valve 60, an etching gas is introduced in the vacuum-processing chamber. An RF power is supplied between the opposite electrodes constituted by the susceptor 34 and the upper chamber 38. A plasma is formed by the etching gas between the opposite electrodes, thereby performing etching.

Therefore, in order to cause this apparatus to operate appropriately, the vacuum degree in the vacuum-processing chamber must be accurately set at a predetermined value. A pressure gage 10 having an anticorrosion property as described above is incorporated in a pressure state detecting unit of the vacuum-processing chamber 37 in order to perform detection of the vacuum degree.

That is, as shown in FIG. 1, the pressure gage 10 is installed on, e.g., a side wall or the like of the vacuum-processing chamber 37 in order to detect the pressure in the chamber 37. A pressure calibration unit 46 which functions as an automatic adjusting circuit for automatically adjusting an output from the pressure gage is connected to the pressure gage 10 to receive an output signal from it. An output from the pressure calibration unit 46 and a pressure instruction are supplied to a pressure control unit 62 which controls the variable valve 60 connected to the pump 48 for evacuating the vacuum-processing chamber 37. As a result, the pump 48 is driven on the basis of a value obtained by calibrating the output signal from the pressure gage 10. Thus, the vacuum degree of the vacuum-processing chamber 37 can be controlled to the predetermined vacuum degree based on the pressure instruction.

Note that in FIG. 1, reference numeral 64 denotes a valve which is opened only when the pressure gage 10 performs calibration; and 66, a Pirani vacuum gage connected to the valve 64.

The pressure calibration unit 46 described above will be described. The pressure calibration unit 46 has a function of automatically calibrating an error over time of the 0 point of the capacitance manometer used as the pressure gage 10. This function is especially important for a magnetron plasma etching apparatus used in a low-pressure range of 0 to several tens of mTorr which is about 1/10 or less of the full scale of 0 to 1 Torr (0 to 10 V) of the capacitance manometer.

FIG. 2 shows the practical configuration of the pressure calibration unit 46 described above. The output terminal of the pressure gage 10 is connected to the input terminal of a preamplifier 12, and the output terminal of the preamplifier 12 is connected to the input terminal of a multiplier 14. The multiplier 14 multiplies an output signal from the pressure gage 10, which is amplified by the preamplifier 12, by N. The output terminal of the multiplier 14 is connected to the input terminal of an analog/digital (A/D) converter 16, and the output terminal of the A/D converter 16 is connected to one input terminal of a central processing unit (CPU) 18. Therefore, an output signal multiplied by N by the multiplier 14 is converted to a digital signal by the A/D converter 16 and input to the CPU 18. The CPU 18 performs pressure calibration and control. Upon reception of a signal from the A/D converter 16, the CPU 18 inverts the sign of the signal value and outputs the inverted value.

The CPU 18 is connected to a digital/analog (D/A) converter 20. The inverted output signal described above is converted to an analog signal by the D/A converter 20 and output. The output terminal of the D/A converter 20 is connected to the input terminal of a divider 22. The divider 22 divides an output from the D/A converter by N, which is a reverse operation to that of the multiplier 14. That is, the divider 22 divides by N the value multiplied by N by the multiplier 14. The output terminal of the divider 22 is connected to one input terminal of an adder 24. The other input terminal of the adder 24 is connected to an output line of the preamplifier 12. The adder 24 adds the two input signals and outputs the sum. One output line of the adder 24 is connected to the CPU 18 through an A/D converter 26, and the other output line thereof is connected to the pressure calibration unit 46 described above during pressure control (to be described later).

In order to cause the pressure calibration unit 46 having the above configuration to operate, the multiplier 14 must receive an error signal a representing a value by which the output signal from the pressure gage 10 is deviated from an accurate vaccum degree. If the pressure gage 10 is of a type which outputs a signal of 0 V when the interior of the vaccum chamber is at a predetermined calibration pressure (vaccum), the error signal a is obtained by causing the pressure gage 10 to operate by keeping the interior of the vacuum chamber at the predetermined calibration pressure and to output a signal. If the capacitance manometer as described above is used as the pressure gage 10, the pump 48 is driven, the variable valve 60 is set to full-opening degree, and whether the interior of the vacuum-processing chamber 37 is set at $10^{-4}$ Torr is checked by the Pirani vacuum gage 66. A value output from the pressure gage 10 obtained in this state is defined as the error value. In other words, since the pressure gage 10 has such an error, the signal does not become 0, and the error signal a is output. The error signal a obtained in this manner is multiplied by N by the multiplier 14 through the preamplifier 12 and output as a signal value (N·a). The output signal is then A/D-converted and supplied to the CPU 18. The multiplication by N is performed due to the following reason. Since the output from the preamplifier 12 is comparatively weak, if adjustment is performed by utilizing this output without any change, the precision is degraded. In addition, if multiplication by N is performed, the number of processing bits of the A/D converter 16 can be decreased. The CPU 18 converts (N·a) to (−N·a′) and outputs it. The output signal is then D/A-converted by the D/A converter 20 and supplied to the divider 22. The divider 22 divides the output signal by N. As a result, the output from the divider 22 is (−a′).

In the adder 24, the signal (−a′) and the signal a directly input from the preamplifier 12 are added. Therefore, the output is 0 V in principle. In this embodiment, however, the signal from the adder 24 is not necessarily 0 V because of an error occurring in the multiplier 14, the CPU 18, or the divider 22. In view of this fact, the output of the adder 24 is fed back to the CPU 18 through the A/D converter 26, and the signal (−N·a′) output from the CPU 18 is fine-adjusted so that the signal from the adder 24 becomes precisely 0 V.

A correction value from the CPU 18 obtained when the signal from the adder 24 becomes 0 V is latched by the D/A converter 20. As a result, an output signal which includes an error and which is thus obtained, from the pressure gage 10 through the preamplifier 12, as a signal value representing the current pressure when the vacuum pump is operated, is added to the correction value, and the output signal is thus corrected to an appropriate value.

Referring to FIG. 2, the multiplier 14 and the A/D converter 16 which are surrounded by a broken line are set in the operative state only during calibration by the pressure gage 10, and are set in the non-operative state during actual pressure control by the variable valve 60. It is possible to prevent the CPU 18 from receiving an output of the A/D converter 16 during pressure control.

The CPU 18 receives a set signal for setting the pressure calibration mode or pressure control mode, and various conditions, e.g., a pressure to be actually set in the vacuum-processing chamber 37 in the pressure control mode. The CPU 18 outputs a display output, a pressure instruction, and the like.

Figure 4B:
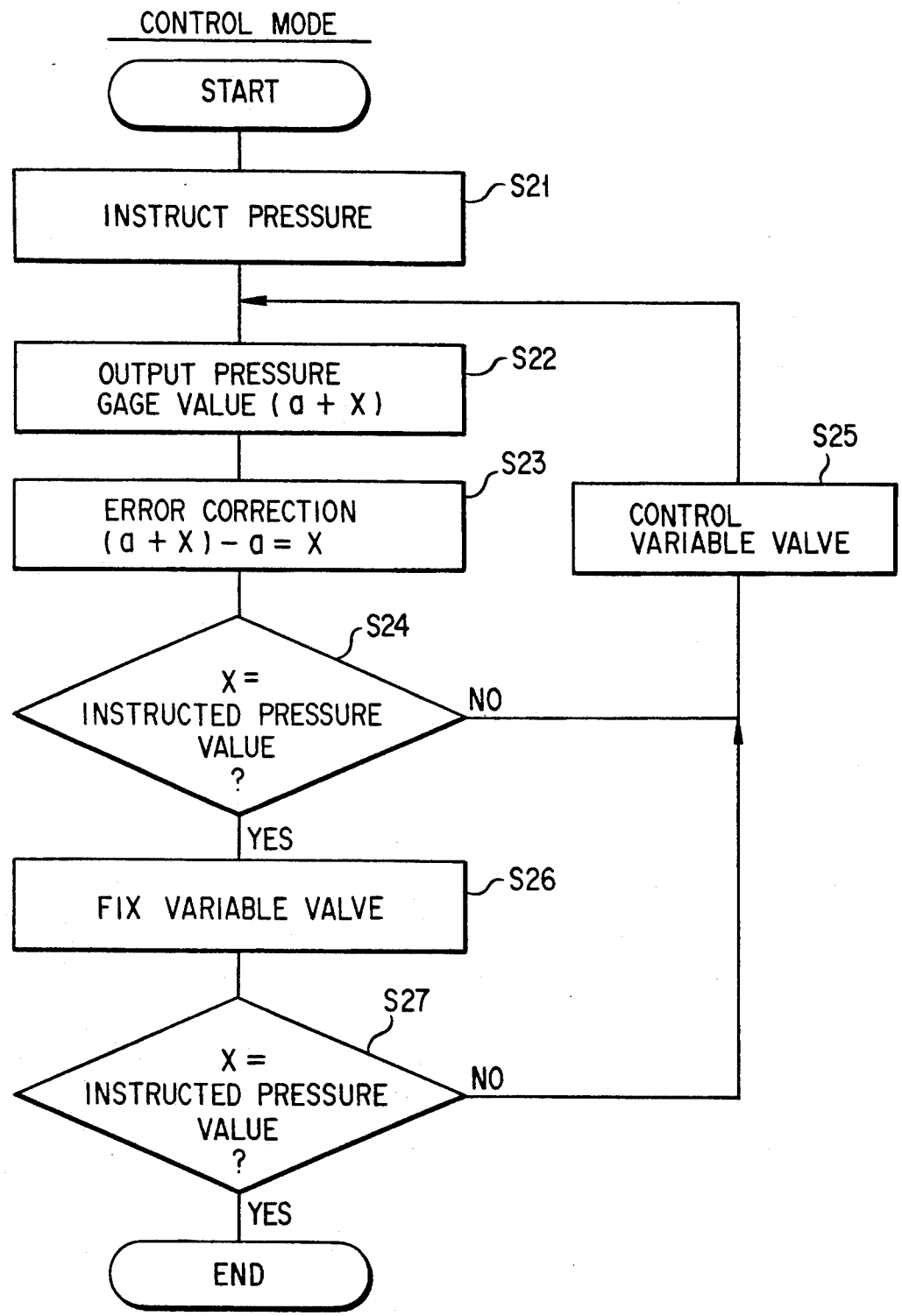

FIG. 3 shows the peripheral circuits of the CPU 18 of FIG. 2 in detail, and FIGS. 4A and 4B are flow charts of FIGS. 1, 2, and 3.

That is, in this case, the peripheral circuits of the CPU 18 are connected, via a bus line BL, to a host computer which controls all steps in manufacturing the semiconductor device. Thus, the various condition inputs described above are fetched by a CPU section 181 and a random access memory (RAM) 183 via the bus line BL, and some of the condition inputs are supplied from an operation panel including a keyboard (not shown) via an I/O interface 183. The I/O interface 183 supplies the pressure instruction described above to the pressure control unit 62. A display unit 28 is provided in order to display data such as, e.g., a vacuum value of the interior of the vacuum-processing chamber 37.

Assume that the pressure calibration mode is set as the condition input. Then, the flow of the calibration mode shown in FIG. 4A is executed.

First, in step S1, an operation for setting the interior of the vacuum-processing chamber 37 to a calibration pressure value is executed. That is, the vacuum pump 48 evacuates the vacuum-processing chamber 37 through the variable valve 60 in accordance with a pressure instruction of $10^{-4}$ Torr, in this case, which is supplied from the pressure control unit 62. In this case, since the valve 64 is open, it can be confirmed by the Pirani vacuum gage 66 that the pressure in the vacuum-processing chamber 37 becomes $10^{-4}$ Torr. At this time, the pressure gage 10 using the capacitance manometer should properly output 0. In fact, however, the output does not become 0, but a certain error value a is output (step S2). The error value a is multiplied by N by the multiplier 14

(step S3) and is converted to a digital value by the A/D converter 16 (step S4). The digital signal is stored in the RAM 182 and its sign is inverted by the CPU section 181. The digital signal is output from the CPU section 181 as a signal ($-N \cdot a'$) (step S5) and converted to an analog signal by the D/A converter 20.

The analog signal ($-N \cdot a'$) is divided by N by the divider 22 to obtain a signal ($-a'$) (step S7). The quotient ($-a'$) is added by the adder 24 to the error value (a) from the preamplifier 12 (step S8). The sum (a—a') is converted to a digital signal by the A/D converter 26 (step S9). The digital signal (a—a') is stored in the RAM 182, and a correction value R ($=-a$) with which the value (a—a') becomes 0 is calculated by the CPU section 181 (step S10). The CPU section 181 checks whether the output (an output from the A/D converter 26 in practice) of the adder 24 is 0 while it outputs the correction value R to the D/A converter 20 (step S11). If NO in step S11, the flow from step S6 is repeated. If YES in step S11, the CPU 181 completes the series of processing, and since then the D/A converter 20 constantly outputs the correction value R as it is latched (step S12). The calibration mode is completed in this manner.

In the above steps, step S1 may be executed when the operator designates the calibration mode.

Subsequently, assume that the pressure control mode is set as a condition input. Then, the flow of the control mode shown in FIG. 4B is executed.

First, when a desired pressure value (e.g., 30 to 40 mTorr) is instructed in step S21, the pressure control unit 62 starts pressure-controlling to the vacuum-processing chamber 37 through the vacuum pump 48 and the variable valve 60. In response to this, the pressure gage 10 outputs a current pressure value (a+x) including the error a (step S22). This current pressure value is added by the adder 24 to the correction value R ($=-a$) and is thus output as x from which the error is eliminated (step S23). The CPU section 181 then determines whether the value x is equal to the instructed pressure value (step S24). If NO in step S24, the CPU section 181 instructs the pressure control unit 62 to appropriately control the opening degree of the variable valve 60 (step S21), and thereafter to repeat the flow from step S22. If YES in step S24, the CPU section 181 controls the opening degree of the variable valve 60 in the same manner as described above (step S26), and thereafter to repeat the same discrimination as that of step S24 a predetermined cycle (step S27). As a result, the interior of the vacuum-processing chamber 37 is controlled at a desired vacuum degree for a processing period required of a magnetron plasma etching apparatus.

In this control mode, as described above, the multiplier 14 and the A/D converter 16 in FIG. 2 are in the non-operative state. Also, the valve 64 in FIG. 1 is closed. Therefore, the Pirani vacuum gage 66 is in the non-operative state.

As is apparent from the above description, the pressure control unit 62 controls the opening degree of the variable valve 60 first in accordance with a pressure instruction value, and thereafter appropriately controls the opening degree thereof in accordance with a current pressure value obtained by subjecting an output from the pressure gage 10 to error correction. The pressure control unit 62 may also execute a function associated with the control of the pressure calibration unit 42 as required.

The preamplifier 12 and the adder 24 may be designed to have a predetermined amplification factor (e.g., 4 times) in order to allow a quick start of evacuation by the entire control system, or to improve the control resolution of the variable valve 60.

The present invention is not limited to the magnetron plasma etching apparatus described by way of the above embodiment, but can similarly be applied to various types of vacuum-processing apparatuses.

In this manner, the vacuum-processing apparatus with the auto-calibration for the pressure gage according to the present invention has a function which is suitable in various types of vacuum-processing apparatuses, e.g., a plasma etching apparatus, the interior of which needs to be precisely set at a predetermined vacuum degree.

As has been described above, according to the vacuum-processing apparatus with the auto-calibration for the pressure gage of the present invention, when an error occurs in an output value from the pressure gage due to a change over time, the output value can be automatically corrected to a normal value without performing volume control adjustment of the pressure gage. As a result, the vacuum-processing apparatus which is controlled based on the output signal from the pressure gage can be correctly operated.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A plasma processing apparatus comprising:
    plasma processing means for processing an object by use of plasma at a predetermined pressure in a plasma processing container;
    a capacitance manometer for detecting a pressure in said plasma processing container as a pressure detection signal, which indicates the pressure and includes erroneous components;
    vacuum creating means for creating a predetermined pressure in said plasma processing container;
    pressure instruction means for, when plasma processing is performed by said plasma processing means, providing a first pressure instruction signal to said vacuum-creating means to set a pressure in said plasma processing container at a predetermined first pressure on the other of several 10 m torr as said predetermined pressure, and when said capacitance manometer is calibrated before plasma processing is performed, providing a second pressure instruction signal to said vacuum-creating means to set the pressure in said plasma processing container at a predetermined second pressure on the order of $10^{-4}$ Torr at which said capacitance manometer cannot operate correctly;
    correction value calculating means for, when the pressure in said plasma processing container is set at said predetermined second pressure in order to calibrate said capacitance manometer in accordance with said second pressure instruction from said pressure instruction means, receiving said pressure detection signal from said capacitance manometer, and calculating a correction value used for canceling said erroneous components previously included in said pressure detection signal;

correcting means for, when the pressure in said plasma-processing container is set at said predetermined first pressure, correcting said pressure detection signal output from said capacitance manometer on the basis of said correction value calculated by said correction value calculating means, thereby to cancel said erroneous components previously included in said pressure detection signal; and pressure controlling means for maintaining said predetermined first pressure in said plasma processing container so that plasma processing is performed in accordance with said pressure detection signal from which said erroneous components have been canceled, wherein said correction value calculating means comprises:

a multiplier for multiplying a signal, a, output from said capacitance manometer by a predetermined multiplier value N;

a first A/D converting means for converting an output signal N·a into a digital signal;

a signal processing means for receiving the digital signal from said first A/D converting means, and outputting a digital signal −N·a corresponding to the output signal N·a;

D/A converting means for converting a digital signal corresponding to the signal −N·a output from said signal processing means into an analog signal; and a divider for dividing said analog signal output from said D/A converting means by N, and outputting a signal, −a′, as said correction value.

2. A plasma processing apparatus according to claim 1, wherein said correction value calculating means comprises:

adding means for adding the signal −a′ output from said divider to the signal a output from said capacitance manometer; and a second A/D converting means for converting an output signal output from said adding means into a digital signal, and outputting the digital signal to said signal processing means so that after said signal processing means outputs a digital signal corresponding to a correction value R which satisfies the equation a−a′=0 to said D/A converting means, said D/A converting means latches said correction value R.

3. A plasma processing apparatus according to claim 2, wherein said adding means can also function as said correction means.

4. A plasma processing apparatus according to claim 1, further comprising a calibration pressure gage for confirming that the pressure in said plasma processing container is set at said predetermined second pressure in accordance with said second pressure instruction from said pressure instruction means.

5. A plasma processing apparatus according to claim 4, wherein said calibration pressure gage includes a Pirani gage which is connected to said plasma processing container through a valve which is opened only when said second pressure instruction is issued from said pressure instruction means.

6. A plasma processing apparatus according to claim 1, wherein said signal processing means includes a CPU.

7. A plasma processing apparatus according to claim 1, further comprising a preamplifier for amplifying the signal output from said capacitance manometer, and supplying an amplified signal a to said correction value calculating means and said correction means.

8. A plasma processing apparatus according to claim 1, wherein said capacitance manometer has a full scale of 0 to 1.0 Torr, and detects said predetermined first pressure on the order of several 10 m Torr which is substantially one tenth of said full scale of the capacitance manometer.

9. A plasma processing apparatus according to claim 1, wherein said pressure instruction means includes means for enabling an operator to manually perform inputting instructions.

10. A plasma processing apparatus according to claim 1, further comprising an RIE type of plasma etcher.

11. A plasma processing apparatus according to claim 10, wherein said plasma processing means comprises:

an upper chamber and a lower chamber, which constitute said plasma processing container, said upper chamber being grounded as a counter electrode of a suscepter, wherein said suscepter is provided in said lower chamber, and functions as an RF cathode;

an electrostatic chuck on which a semiconductor wafer is placed as an object to be processed, and which is arranged on said suscepter;

an RF power source for supplying a predetermined RF power to said suscepter; and a direct current power source for supplying a predetermined direct current power to said electrostatic chuck.

12. A plasma processing apparatus according to claim 11, wherein said plasma processing means comprises a permanent magnet, arranged on an upper side of said upper chamber, for producing a parallel magnetic field on a surface of said semiconductor wafer which is placed on said electrostatic chuck.

13. A pressure controlling method employing a capacitor manometer, for use in a plasma processing apparatus, wherein said plasma processing apparatus processes an object by use of plasma at a predetermined pressure in a plasma processing container, said capacitance manometer detecting a pressure in said plasma processing container as a pressure detection signal, which includes erroneous components, said method comprising the steps of:

providing a first pressure instruction signal to a vacuum creating means to set a pressure in said plasma processing container at a predetermined first pressure on the order of several 10 m Torr as the predetermined pressure, when the plasma processing is performed by said plasma processing apparatus, and when said capacitor manometer is calibrated before the plasma processing is performed by said plasma apparatus, providing a second pressure instruction signal to said vacuum creating means to set the pressure in said plasma processing container at a predetermined second pressure on the order of $10^{-4}$ Torr at which said capacitor manometer cannot correctly operate;

calculating a correction value used for canceling said erroneous components previously included in said pressure detection signal output from said capacitance manometer, after receiving said pressure detection signal from said capacitance manometer when the pressure in said plasma processing container is set at said predetermined second pressure in order to calibrate said capacitance manometer in accordance with said second pressure instruction signal;

correcting said pressure detection signal output from said capacitance manometer on the basis of the calculated correction value, when the pressure in said plasma processing container is set at the predetermined first pressure in order to perform plasma processing in accordance with said first pressure instruction signal, thereby to cancel said erroneous components previously included in said pressure detection signal; and maintaining said predetermined first pressure in said plasma processing container so that plasma processing is performed in accordance with said pressure detection signal from which said erroneous components have been canceled, wherein said calculating step comprises the steps of:

multiplying a signal, a, output from said capacitance manometer by a predetermined multiplier N;

A/D-converting a signal N·a output in said multiplying step into a first digital signal;

producing, after receiving said first digital signal, a second digital signal −N·a which corresponds to said signal N·a;

D/A-converting said second digital signal produced in said producing step into an analog signal; and dividing said analog signal by N, thereby to output a signal −a' indicating said correction value.

14. A method according to claim 13, wherein said calculating step comprises the steps of:

adding said signal −a' output in said dividing step to said signal a output from said capacitance manometer to produce an added output signal;

A/D-converting said added output signal into a second digital signal;

producing a third digital signal which corresponds to a correction value R, which satisfies the equation a−a'=0, in accordance with said second digital signal;

latching said third digital signal; and

D/A-converting said third digital signal into an analog signal.

15. A method according to claim 13, further comprising the step of:

confirming that the pressure in said plasma processing container is set at said predetermined second pressure in accordance with said second pressure instruction signal.

16. A method according to claim 15, wherein said confirming step is executed by use of a Pirani gage which is connected to said plasma processing container through a valve which is opened only when said second pressure instruction signal is provided.

17. A method according to claim 13, wherein said producing step is executed by a CPU.

18. A method according to claim 13, further comprising the step of:

pre-amplifying said pressure detection signal output from said capacitance manometer.

* * * * *